(12) United States Patent
Lee et al.

(10) Patent No.: US 10,136,515 B2
(45) Date of Patent: Nov. 20, 2018

(54) FLEXIBLE PRINTED CIRCUIT BOARD

(71) Applicant: Samsung SDI Co., Ltd., Yongin-si, Gyeonggi-do (KR)

(72) Inventors: Woo-Jin Lee, Yongin-si (KR); Seong-Joon Lee, Yongin-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 154 days.

(21) Appl. No.: 14/935,077

(22) Filed: Nov. 6, 2015

(65) Prior Publication Data

US 2016/0374200 A1    Dec. 22, 2016

(30) Foreign Application Priority Data

Jun. 18, 2015  (KR) .................. 10-2015-0086711

(51) Int. Cl.
   *H05K 1/11*    (2006.01)
   *H05K 3/36*    (2006.01)

(52) U.S. Cl.
   CPC ............. *H05K 1/118* (2013.01); *H05K 3/363* (2013.01); *H05K 2201/0397* (2013.01); *H05K 2201/09172* (2013.01); *H05K 2201/10977* (2013.01)

(58) Field of Classification Search
   CPC .................. H05K 1/118; H05K 3/363; H05K 2201/0397; H05K 2201/09172; H05K 2201/10977
   USPC ........................................................ 361/803
   See application file for complete search history.

(56) References Cited

U.S. PATENT DOCUMENTS

| 6,840,428 | B2 | 1/2005 | Wong et al. |
| 2008/0193074 | A1* | 8/2008 | Sugiyama ............. G02F 1/2255 385/8 |
| 2012/0248466 | A1* | 10/2012 | Park .................... H01L 27/3276 257/88 |
| 2013/0264103 | A1* | 10/2013 | Ye ........................ H05K 1/0213 174/254 |
| 2014/0264305 | A1* | 9/2014 | Takahara ............ H01L 27/3279 257/40 |

FOREIGN PATENT DOCUMENTS

| JP | 04254826 A | * | 9/1992 |
| JP | 2003-179348 A | | 6/2003 |
| JP | 4768355 B2 | | 6/2011 |

* cited by examiner

*Primary Examiner* — Eric Thomas
*Assistant Examiner* — Michael P McFadden
(74) *Attorney, Agent, or Firm* — Knobbe Martens Olson & Bear LLP

(57) ABSTRACT

A flexible printed circuit board is disclosed. In one aspect, the flexible printed circuit board includes a plurality of signal-transmitting lines formed in a signal-transmitting area and a plurality of first pads formed in a pad area adjacent to the signal-transmitting area and electrically connected to the signal-transmitting lines. The flexible printed circuit board also includes an adhesive-penetrating groove formed between two adjacent ones of the first pads. The adhesive-penetrating groove is formed in a length direction extending from the pad area to at least a portion of the signal-transmitting area.

18 Claims, 3 Drawing Sheets

FLEXIBLE PRINTED CIRCUIT BOARD

CROSS-REFERENCE TO RELATED APPLICATION

This application claims priority to and the benefit of Korean Patent Application No. 10-2015-0086711 filed in the Korean Intellectual Property Office on Jun. 18, 2015, the entire contents of which are incorporated herein by reference.

BACKGROUND

Field

The described technology generally relates to a flexible printed circuit board.

Description of the Related Technology

A printed circuit board is manufactured by printing a conductive material such as copper and the like on a board that is formed of a phenolic, an epoxy, and the like. The printed circuit board is generally connected to a flexible printed circuit board (FPCB) to transmit and receive a signal to and from an external circuit.

A number of pads of the printed circuit board and a number of pads of the flexible printed circuit board are soldered to be electrically connected to each other. Also, an adhesive such as glue is coated on the printed circuit board and the flexible printed circuit board for securing the contact points.

However, since the adhesive is not able to be coated on an area where the printed circuit board and the flexible printed circuit board contact each other and can sometimes only be coated on the remaining area, adherence can be weak.

Accordingly, it is required that the adhesive is coated on the area where the printed circuit board and the flexible printed circuit board contact each other.

The above information disclosed in this Background section is only to enhance the understanding of the background of the disclosure and therefore it may contain information that does not form the prior art that is already known in this country to a person of ordinary skill in the art.

SUMMARY OF CERTAIN INVENTIVE ASPECTS

One inventive aspect relates to a flexible printed circuit board that includes an adhesive-penetrating groove so as to improve adherence.

Another aspect is a flexible printed circuit board including: a plurality of signal-transmitting lines formed in a signal-transmitting area; a plurality of first pads formed in a pad area adjacent to the signal-transmitting area and electrically connected to the plurality of signal-transmitting lines; and an adhesive-penetrating groove formed between two adjacent first pads of the plurality of first pads, wherein the adhesive-penetrating groove may be formed in a length direction from the pad area to at least a portion of the signal-transmitting area.

The first pad may be electrically connected to a second pad of a printed circuit board, and a length of the adhesive-penetrating groove may be shorter than that from the second pad to one end of the printed circuit board.

The first pad and the second pad may be electrically connected to each other by soldering, and an adhesive may be coated on an area in which the adhesive-penetrating groove is included.

The adhesive may be penetrated through the adhesive-penetrating groove such that a rear surface of the flexible printed circuit board may be fixed to the printed circuit board.

The adhesive may be formed of a thermal hardening resin.

The plurality of signal-transmitting lines may be formed in a first direction, and the plurality of first pads may be spaced apart from each other in a second direction.

The plurality of signal-transmitting lines and the plurality of first pads may be formed of a conductive material on an insulating film, and the adhesive-penetrating groove may be formed as a void of the insulating film.

Another aspect is a flexible printed circuit board comprising: a plurality of signal-transmitting lines formed in a signal-transmitting area; a plurality of first pads formed in a pad area adjacent to the signal-transmitting area and electrically connected to the signal-transmitting lines; and an adhesive-penetrating groove formed between two adjacent ones of the first pads, wherein the adhesive-penetrating groove is formed in a length direction extending from the pad area to at least a portion of the signal-transmitting area.

In the above flexible printed circuit board, the first pads are electrically connected to a plurality of corresponding second pads of a printed circuit board, and wherein the length of the adhesive-penetrating groove is shorter than the distance between each of the second pads and one end of the printed circuit board. In the above flexible printed circuit board, the first and second pads are electrically connected to each other by soldering, and wherein an adhesive is coated on an area in which the adhesive-penetrating groove is formed. In the above flexible printed circuit board, the adhesive is formed in the adhesive-penetrating groove such that a rear surface of the flexible printed circuit board is fixed to the printed circuit board.

In the above flexible printed circuit board, the adhesive is formed of a thermal hardening resin. In the above flexible printed circuit board, the signal-transmitting lines are formed in a first direction, and wherein the first pads are spaced apart from each other in a second direction crossing the first direction. In the above flexible printed circuit board, each of the signal-transmitting lines and the first pads are formed of a conductive material on an insulating film, and wherein the adhesive-penetrating groove is formed as a void of the insulating film. The above flexible printed circuit board further comprises an insulating film covering the signal-transmitting lines. In the above flexible printed circuit board, the adhesive-penetrating groove is formed in the insulating film.

In the above flexible printed circuit board, each of the signal-transmitting lines includes a body portion and an end portion that is wider than the body portion, and wherein at least a portion of the adhesive-penetrating groove is formed at a border of the body portion and the end portion of each signal-transmitting line. In the above flexible printed circuit board, the width of the adhesive-penetrating groove is greater than or substantially the same as the width of each of the first pads, and where the width is defined in a direction substantially perpendicular to the length direction. In the above flexible printed circuit board, the length of the adhesive-penetrating groove is less than the length of each first pad, and wherein the length is defined in the length direction.

Another aspect is a flexible printed circuit board comprising: a plurality of signal-transmitting lines formed in a signal-transmitting area; a plurality of first pads formed in a pad area adjacent to the signal-transmitting area and electrically connected to the signal-transmitting lines; an insulating film covering the signal-transmitting lines, wherein the insulating film defines at least one groove configured to pass through an adhesive and formed between adjacent ones of the signal-transmitting lines.

In the above flexible printed circuit board, the first pads are electrically connected to a plurality of corresponding second pads of a printed circuit board, and wherein the length of the groove is shorter than the distance between each of the second pads and one end of the printed circuit board. In the above flexible printed circuit board, an adhesive is coated on an area in which the groove is formed, and wherein the adhesive is formed in the groove such that a rear surface of the flexible printed circuit board is fixed to the printed circuit board. In the above flexible printed circuit board, each of the signal-transmitting lines includes a body portion and an end portion that is wider than the body portion, and wherein at least a portion of the groove is formed at a border of the body portion and the end portion of each signal-transmitting line.

In the above flexible printed circuit board, the width of the groove is greater than or substantially the same as the width of each of the first pads, and where the width is defined in a direction substantially perpendicular to the length direction. In the above flexible printed circuit board, the length of the groove is less than the length of each of the first pads, and wherein the length is defined in the length direction. In the above flexible printed circuit board, at least one of the signal-transmitting lines is linear, and wherein at least two of the signal-transmitting lines are non-linear. In the above flexible printed circuit board, the at least one groove comprises a plurality of grooves, and wherein the non-linear portions of the signal-transmitting lines are formed adjacent to the grooves.

According to at least one of the disclosed embodiments, the flexible printed circuit board includes an adhesive-penetrating groove so as to improve adherence may be provided.

DETAILED DESCRIPTION OF CERTAIN INVENTIVE EMBODIMENTS

Figure 1:
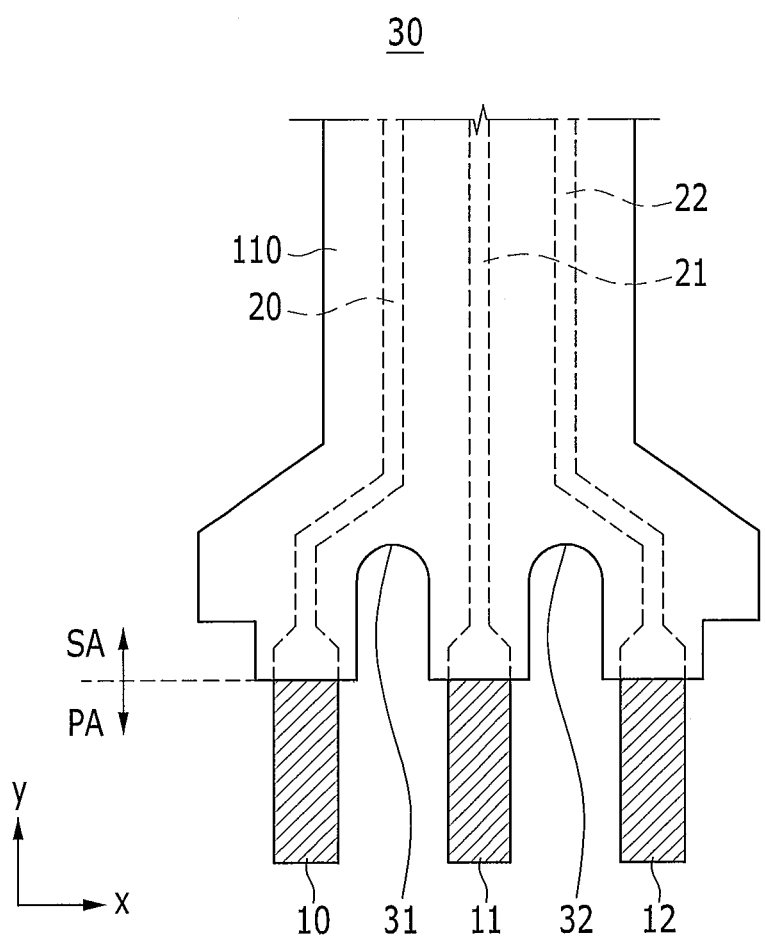
FIG. 1 illustrates a top plan view of a flexible printed circuit board according to an exemplary embodiment.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In this disclosure, the term "substantially" includes the meanings of completely, almost completely or to any significant degree under some applications and in accordance with those skilled in the art. The term "connected" includes an electrical connection.

FIG. 1 illustrates a top plan view of a flexible printed circuit board 30 according to an exemplary embodiment.

Referring to FIG. 1, the flexible printed circuit board 30 includes a first insulating film 100 (refer to FIG. 3), a second insulating film 110, a plurality of first pads 10, 11, and 12, and a plurality of signal-transmitting lines 20, 21, and 22.

The first insulating film 100 may be formed of a flexible insulation material such as a polyimide.

A conductive material such as copper (Cu) can be coated or deposited on the first insulating film 100 and then etched such that the signal-transmitting lines 20-22 and the first pads 10-12 are formed thereon. Alternatively, the signal-transmitting lines 20-22 and the first pads 10-12 are previously formed, and then they may be adhered to the first insulating film 100 through an adhesive layer (not shown).

The signal-transmitting lines 20-22 and the first pads 10-12 may be integrally formed of the same conductive material. Conductive materials formed on a signal-transmitting area (SA) are referred to as the signal-transmitting lines 20-22, and conductive materials formed on a pad area (PA) are referred to as the plurality of first pads 10-12. Although the first pads 10-12 and the signal-transmitting lines 20-22 are integrally formed, they functionally differently operate.

The signal-transmitting lines 20-22 serve to transmit electrical signals and power. The first pads 10-12 are connected to pads of an external circuit by soldering or using a conductive adhesive. Connection between pads will be described in detail with reference to FIGS. 2 and 3. However, although only soldering will be described in FIGS. 2 and 3, a conductive adhesive such as an anisotropic conductive film (ACF) may also be used for connection between the pads instead of the soldering.

The signal-transmitting lines 20-22 are substantially extended in a first direction (y), and the first pads 10-12 are spaced apart from each other in a second direction (x).

Adhesive-penetrating grooves are formed between two adjacent first pads of the first pads 10-12.

That is, an adhesive-penetrating groove 31 is formed between first pads 10 and 11, and an adhesive-penetrating groove 32 is formed between first pads 11 and 12.

Although three first pads 10-12 are formed in FIG. 1, if two first pads are formed, one adhesive-penetrating groove is sufficient. However, four or more first pads may be formed.

The adhesive-penetrating grooves 31 and 32 may be formed as voids of the first insulating film 100 and the second insulating film 110. That is, the adhesive-penetrating grooves may be formed by etching the formed first and second insulating films 100 and 110, or they may be simultaneously or concurrently formed when the first and second insulating films 100 and 110 are formed. Each of the signal-transmitting lines 20-22 includes a body portion and an end portion that is wider than the body portion (see FIG. 1). At least a portion of each of the adhesive-penetrating grooves 31 and 32 can be formed at a border of the body portion and the end portion of each of the signal-transmitting lines 20-22 (see FIG. 1).

The adhesive-penetrating grooves 31 and 32 are formed in a length direction extending from the pad area (PA) to at least a portion of signal-transmitting area (SA). The width of each of the adhesive-penetrating grooves 31 and 32 can be greater than or substantially the same as the width of each of the first pads 10-12, where the width is defined in the horizontal or "x" direction. The length of each of the adhesive-penetrating grooves 31 and 32 can be less than the length of each of the first pads 10-12, where the length is defined in the vertical or "y" direction.

The length direction of the adhesive-penetrating grooves 31 and 32 is a direction of long axes of the adhesive-penetrating grooves 31 and 32, which is the first direction (y) of FIG. 1.

In the present embodiment, since the adhesive-penetrating grooves 31 and 32 are formed beyond or outside the pad area (PA), an adhesive may be coated evenly over all of the pad area (PA). This will be described with reference to FIGS. 2 and 3.

The second insulating film 110 is stacked after the signal-transmitting lines 20-22 and the first pads 10-12 are formed. Although adhesive layers are further formed between respective layers, a description thereof will be omitted. In the present exemplary embodiment, although one conductor layer is shown, two or more conductor layers may be formed with the insulating layer therebetween.

As shown in FIG. 1, the first and second insulating film 100 and 110 are removed from on the pad area (PA) such that the first pads 10-12 are exposed.

Figure 2:
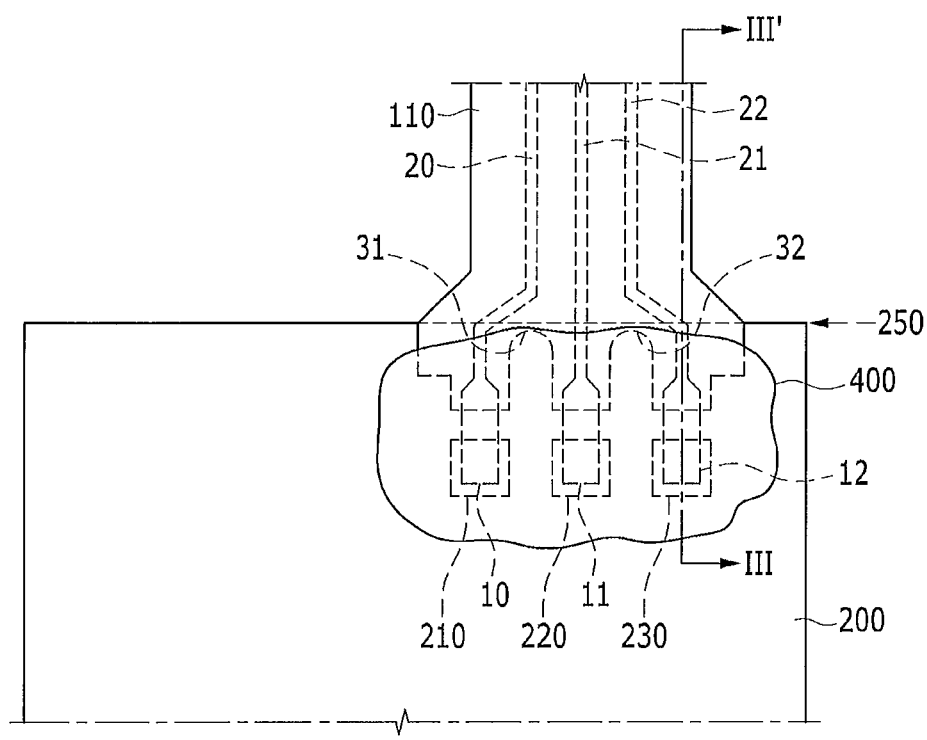
FIG. 2 illustrates a schematic diagram of a shape in which a flexible printed circuit board and a printed circuit board are bonded, according to an exemplary embodiment.
Figure 3:
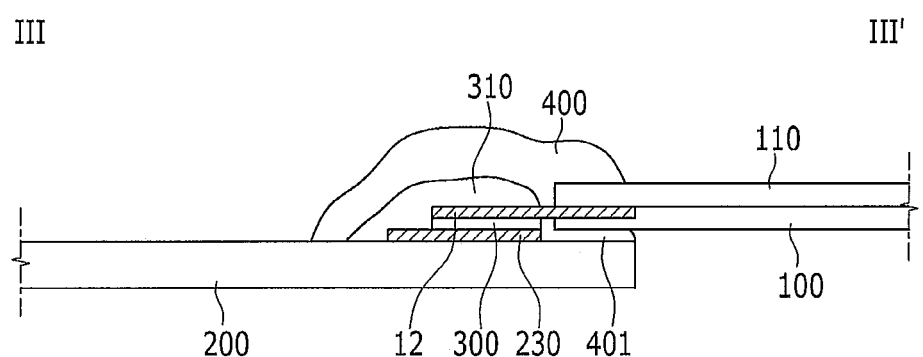
FIG. 3 illustrates a cross-sectional view of FIG. 2 taken along line III-III'.

FIG. 2 illustrates a schematic diagram of a shape in which a flexible printed circuit board and a printed circuit board are bonded, according to an exemplary embodiment of the present disclosure. FIG. 3 illustrates a cross-sectional view of FIG. 2 taken along line III-III'.

Referring to FIGS. 2 and 3, the flexible printed circuit board is fixed by a printed circuit board 200 to which a signal is transmitted and an adhesive 400.

For clarity of illustration, solder 310 (see FIG. 3) is not shown in FIG. 2.

FIGS. 2 and 3 are simply shown so that the printed circuit board 200 may include only second pads 210, 220, and 230. Although not shown, the printed circuit board 200 transmits and receives a signal and receives power through the second pads 210, 220, and 230 to serve to perform a predetermined operation.

The flexible printed circuit board is formed so that the first pads 10-12 respectively correspond to the second pads 210, 220, and 230. In this case, a preliminary solder 300 may be previously coated on the second pads 210, 220, and 230. The preliminary solder 300 may include a solder cream.

When the first pads 10-12 are formed on the flexible printed circuit board to overlap with the second pads 210, 220, and 230, the solder 310 can be electrically connected to the first pads 10-12 and the second pads 210, 220, and 230 by soldering.

The solder 310 may be formed of an alloy consisting of tin (Sn), lead (Pb), and the like.

After soldering, adhesives 400 and 401 are coated thereon so that adherence of the first pads 10-12 and the second pads 210, 220, and 230 may be strengthened. The adhesives 400 and 401 may be coated on an area in which the adhesive-penetrating grooves 31 and 32 are included.

In this case, since the adhesives 400 and 401 are not hardened and thus are in a state of low viscosity, if the adhesive-penetrating grooves 31 and 32 are formed exceedingly long, the adhesives 400 and 401 may flow outside the printed circuit board 200.

Accordingly, as shown in FIG. 2, a length of the adhesive-penetrating grooves 31 and 32 may be shorter than a length from the second pads 210, 220, and 230 to one end 250 of the printed circuit board 20.

The adhesives 400 and 401 may be formed of a thermal hardening resin, an ultraviolet ray hardening resin, or the like. Although the adhesives 400 and 401 have low viscosity in an initial state, they are hardened after a predetermined time passes, thereby fixing the flexible printed circuit board and the printed circuit board 200.

The adhesives 400 and 401 may be rapidly hardened by applying heat to the thermal hardening resin, or by irradiating ultraviolet rays to an ultraviolet ray hardening resin. However, since ultraviolet rays may not be sufficiently irradiated to the adhesive 401 due to a structure of the flexible printed circuit board, the adhesives 400 and 401 formed of the thermal hardening resin may be more preferable.

The adhesive 400 fixes the flexible printed circuit board and the printed circuit board 200 in an upper position thereof, and the adhesive 401 fixes the flexible printed circuit board and the printed circuit board 200 in a lower position thereof. That is, the adhesive 401 penetrated through the adhesive-penetrating grooves 31 and 32 fixes a rear surface of the flexible printed circuit board to the printed circuit board 200. Accordingly, adherence is strengthened.

Further, since the adhesive 401 is filled in a space between the first insulating film 100 and the printed circuit board 200, the hardened adhesive 401 may support the printed circuit board 200 and the first insulating film 100.

While the inventive technology has been described in connection with exemplary embodiments, the drawings and the detailed description of the present disclosure which are described above are merely illustrative, are just used for the purpose of describing the present disclosure, and are not used for qualifying the meaning or limiting the scope of the present disclosure, which is disclosed in the appended claims. Therefore, it will be understood by those skilled in the art that various modifications and other equivalent exemplary embodiments may be made from the present disclosure. Accordingly, an actual technical protection scope of the present disclosure is to be defined by the claims.

What is claimed is:
1. A flexible printed circuit board comprising:
   a plurality of signal-transmitting lines formed in a signal-transmitting area;
   an insulating film covering the signal-transmitting lines;
   a plurality of first pads formed in a pad area adjacent to the signal-transmitting area and electrically connected to the signal-transmitting lines; and
   an adhesive-penetrating groove formed between two adjacent ones of the first pads, wherein the adhesive-penetrating groove is formed in the insulating film,
   wherein the adhesive-penetrating groove is formed in a length direction extending from the pad area to at least a portion of the signal-transmitting area,
   wherein the adhesive-penetrating groove is formed as a void so that an adhesive coated on a first surface of the flexible printed circuit board penetrates through the adhesive-penetrating groove to be filled in a space between a second surface of the flexible printed circuit board and a printed circuit board (PCB), and
   wherein the void penetrates entirely through the flexible printed circuit board and the first and second surfaces that are on different planes and formed on different surfaces of the flexible printed circuit board.
2. The flexible printed circuit board of claim 1, wherein the first pads are electrically connected to a plurality of corresponding second pads of the PCB, and wherein the length of the adhesive-penetrating groove is shorter than the distance between each of the second pads and one end of the PCB.

3. The flexible printed circuit board of claim 2, wherein the first and second pads are electrically connected to each other by soldering.

4. The flexible printed circuit board of claim 3, wherein the adhesive is formed in the adhesive-penetrating groove such that a rear surface of the flexible printed circuit board is fixed to PCB.

5. The flexible printed circuit board of claim 4, wherein the adhesive is formed of a thermal hardening resin.

6. The flexible printed circuit board of claim 1, wherein the signal-transmitting lines are formed in a first direction, and wherein the first pads are spaced apart from each other in a second direction crossing the first direction.

7. The flexible printed circuit board of claim 1, wherein each of the signal-transmitting lines and the first pads are formed of a conductive material on the insulating film, and wherein the adhesive-penetrating groove is formed as a void of the insulating film.

8. The flexible printed circuit board of claim 1, wherein each of the signal-transmitting lines includes a body portion and an end portion that is wider than the body portion, and wherein at least a portion of the adhesive-penetrating groove is formed at a border of the body portion and the end portion of each signal-transmitting line.

9. The flexible printed circuit board of claim 1, wherein the length of the adhesive-penetrating groove is less than the length of each first pad, and wherein the length is defined in the length direction.

10. A flexible printed circuit board comprising:
a plurality of signal-transmitting lines formed in a signal-transmitting area;
a plurality of first pads formed in a pad area adjacent to the signal-transmitting area and electrically connected to the signal-transmitting lines; and
an adhesive-penetrating groove formed between two adjacent ones of the first pads,
wherein the adhesive-penetrating groove is formed in a length direction extending from the pad area to at least a portion of the signal-transmitting area,
wherein the adhesive-penetrating groove is formed as a void so that an adhesive coated on a first surface of the flexible printed circuit board penetrates through the adhesive-penetrating groove to be filled in a space between a second surface of the flexible printed circuit board and a printed circuit board (PCB),
wherein the width of the adhesive-penetrating groove is greater than or substantially the same as the width of each of the first pads, and wherein the width is defined in a direction substantially perpendicular to the length direction.

11. A flexible printed circuit board comprising:
a plurality of signal-transmitting lines formed in a signal-transmitting area;
a plurality of first pads formed in a pad area adjacent to the signal-transmitting area and electrically connected to the signal-transmitting lines; and
an insulating film covering the signal-transmitting lines, wherein the insulating film defines at least one groove formed between adjacent ones of the signal-transmitting lines, wherein the groove is formed as a void so that an adhesive coated on a first surface of the flexible printed circuit board penetrates through the groove to be filled in a space between a second surface of the flexible printed circuit board and a printed circuit board (PCB), and wherein the void penetrates entirely through the flexible printed circuit board and the first and second surfaces that are on different planes and formed on different surfaces of the flexible printed circuit board.

12. The flexible printed circuit board of claim 11, wherein the first pads are electrically connected to a plurality of corresponding second pads of the PCB, and wherein the length of the groove is shorter than the distance between each of the second pads and one end of the printed circuit board.

13. The flexible printed circuit board of claim 12, wherein the adhesive is coated on an area in which the groove is formed, and wherein the adhesive is formed in the groove such that a rear surface of the flexible printed circuit board is fixed to the PCB.

14. The flexible printed circuit board of claim 11, wherein each of the signal-transmitting lines includes a body portion and an end portion that is wider than the body portion, and wherein at least a portion of the groove is formed at a border of the body portion and the end portion of each signal-transmitting line.

15. The flexible printed circuit board of claim 11, wherein the length of the groove is less than the length of each of the first pads, and wherein the length is defined in the length direction.

16. The flexible printed circuit board of claim 11, wherein at least one of the signal-transmitting lines is linear, and wherein at least two of the signal-transmitting lines are non-linear.

17. The flexible printed circuit board of claim 16, wherein the at least one groove comprises a plurality of grooves, and wherein the non-linear portions of the signal-transmitting lines are formed adjacent to the grooves.

18. A flexible printed circuit board comprising:
a plurality of signal-transmitting lines formed in a signal-transmitting area;
a plurality of first pads formed in a pad area adjacent to the signal-transmitting area and electrically connected to the signal-transmitting lines; and
an insulating film covering the signal-transmitting lines, wherein the insulating film defines at least one groove formed between adjacent ones of the signal-transmitting lines, wherein the groove is formed as a void so that an adhesive coated on a first surface of the flexible printed circuit board penetrates through the groove to be filled in a space between a second surface of the flexible printed circuit board and a printed circuit board (PCB),
wherein the width of the groove is greater than or substantially the same as the width of each of the first pads, and wherein the width is defined in a direction substantially perpendicular to the length direction.

* * * * *